(12) United States Patent
Kanda et al.

(10) Patent No.: US 8,953,404 B2
(45) Date of Patent: Feb. 10, 2015

(54) SEMICONDUCTOR DEVICE HAVING AN ELECTRICAL FUSE ELEMENT

(75) Inventors: Yasuo Kanda, Kanagawa (JP); Koichi Amari, Kanagawa (JP); Shunsaku Tokito, Kanagawa (JP); Yuji Torige, Kanagawa (JP); Takayuki Arima, Nagasaki (JP); Takafumi Kunihiro, Kanagawa (JP)

(73) Assignee: Sony Corporation, Tokyo (JP)

( * ) Notice: Subject to any disclaimer, the term of this patent is extended or adjusted under 35 U.S.C. 154(b) by 409 days.

(21) Appl. No.: 13/185,127

(22) Filed: Jul. 18, 2011

(65) Prior Publication Data
US 2012/0026822 A1 Feb. 2, 2012

(30) Foreign Application Priority Data
Jul. 30, 2010 (JP) ................... 2010-172205

(51) Int. Cl.
*G11C 17/18* (2006.01)
*G11C 17/00* (2006.01)
*H01L 23/525* (2006.01)
*G11C 17/16* (2006.01)

(52) U.S. Cl.
CPC ............ *H01L 23/5256* (2013.01); *G11C 17/16* (2013.01)
USPC ......................... 365/225.7; 365/96

(58) Field of Classification Search
CPC ............................. G11C 17/16; H01K 23/5256
USPC ........................... 365/96, 225.7, 210.14, 200
See application file for complete search history.

(56) References Cited

U.S. PATENT DOCUMENTS

2002/0167323 A1* 11/2002 Khoury ................... 324/550
2007/0140034 A1*  6/2007 Mori et al. ............... 365/225.7

FOREIGN PATENT DOCUMENTS

JP    08-335674    12/1996
JP    2006-253353   9/2006

* cited by examiner

*Primary Examiner* — Vanthu Nguyen
*Assistant Examiner* — Khamdan Alrobaie
(74) *Attorney, Agent, or Firm* — Sony Corporation

(57) ABSTRACT

A semiconductor device has an electrical fuse element including: a first filament; a second filament connected to the first filament; and a series readout section connected to an end of the first filament opposite to another end of the first filament connected to the second filament, the series readout section reading series resistance of the first filament and the second filament.

15 Claims, 8 Drawing Sheets

SEMICONDUCTOR DEVICE HAVING AN ELECTRICAL FUSE ELEMENT

FIELD

The present disclosure relates to a semiconductor device and a method of driving the same. More particularly, the present disclosure relates to a semiconductor device having an electrical fuse and a method of driving the semiconductor device.

BACKGROUND

An electrical fuse is an important electronic element for trimming an electronic circuit of a semiconductor device.

JP-A-8-335674 (Patent Document 1) discloses a method of trimming a semiconductor device employing an electrical fuse.

For example, methods of trimming semiconductor device employing an electrical fuse have been used for purposes such as remedying a defect of a semiconductor memory device.

For example, a normal memory cell array is fabricated by disposing a multiplicity of normal semiconductor memory cells in the form of a matrix, and a redundant memory cell is also fabricated by disposing a multiplicity of redundant memory cells for remedy.

When any of the memory cells of the normal memory cell array has a defect, the defective memory cell is switched to a redundant memory cell.

The above approach is effective in achieving high yield of semiconductor memory devices.

Electrical fuses are widely used in applications involving switching of electrical connections in electronic circuits forming semiconductor devices other than repairing techniques including the step of switching a defective memory cell to a redundant memory cell as described above.

Recently, the trend toward logic circuits and CMOS image sensors having higher and increased functions has resulted in demands for electrical fuses with greater capacities.

The use of an electrical fuse having an increased capacity increases the size of a semiconductor chip employing the fuse and consequently results in the cost of the semiconductor chip.

For example, the resistance of a filament of an electrical fuse having a filament structure formed by a polysilicon layer and a high melting point metal silicide layer is changed by applying a pulse voltage to the filament.

For example, the operation is based on the fact that the resistance of the electrical fuse changes from an initial value to another value when electro migration is caused at the high melting point silicide layer and changes to still another value when the migration is continued into the phase of silicon melting.

When it is attempted to increase the capacity of an electrical fuse through the same process as described above with the shape of the filament kept unchanged, the area occupied by the fuse can increase.

In general, the area occupied by an electrical fuse may be reduced by processing the fuse with higher fineness, and a multiplicity of resistance values may be obtained by a fuse element having a MONOS structure which is provided by additional processing steps. However, such approaches result in the problem of a cost increase. A MONOS structure is a film having layers of a metal, an oxide, a nitride, another oxide, and a semiconductor.

JP-A-2006-25353 (Patent Document 2) discloses an electrical fuse module provided by connecting filaments in parallel and parallel-connecting a switching transistor for program control and a readout transistor to the filaments.

The electrical fuse module can provide information representing a greater number of values in the form of changes in the resistance of the parallel-connected filaments.

However, the configuration of the electrical fuse module disclosed in Patent Document 2 is disadvantageous in that changes in resistance cannot be accurately read out because resistance values can be obtained only through parallel read-out from parallel-connected filaments.

SUMMARY

It is desirable to provide a semiconductor including a reliable multi-valued electrical fuse which can be manufactured using existing processes without any additional processing step.

An embodiment of the present disclosure is directed to a semiconductor device having an electrical fuse element including a first filament, a second filament connected to the first filament, and a series readout section connected to an end of the first filament opposite to another end of the first filament connected to the second filament, the series readout section reading series resistance of the first filament and the second filament.

The semiconductor device according to the present disclosure has the electrical fuse element including the first filament and the second filament connected to the first filament.

The electrical fuse element has the series readout section connected to an end of the first filament opposite to another end of the first filament connected to the second filament. The series readout section reads series resistance of the first filament and the second filament.

Another embodiment of the present disclosure is directed to a semiconductor device having an electrical fuse element including a first filament, a second filament connected to the first filament, a first selection transistor series-connected to the first filament for selecting the first filament, a second selection transistor series-connected to the second filament for selecting the second filament; and a parallel readout section connected to the connection between the first filament and the second filament, the parallel readout section reading parallel resistance of the first filament and the second filament.

The semiconductor device according to the above-described embodiment of the present disclosure has the electrical fuse element including the first filament, the second filament connected to the first filament.

The electrical fuse element also includes the first selection transistor series-connected to the first filament for selecting the first filament and the second selection transistor series-connected to the second filament for selecting the second filament. Further, the electrical fuse element includes the parallel readout section connected to the connection between the first filament and the second filament. The parallel readout section reads parallel resistance of the first filament and the second filament.

Still another embodiment of the present disclosure is directed to a method of driving a semiconductor device including an electrical fuse element having a first filament and a second filament connected to the first filament. The method includes reading a series resistance of the first filament and the second filament using a serial readout section connected to an end of the first filament opposite to another end thereof connected to the second filament.

The method of driving a semiconductor device according to the above-described embodiment of the present disclosure reads the electrical fuse of the semiconductor device including the electrical fuse including the first filament and the second filament.

In this embodiment, the series resistance of the first filament and the second filament is read out using the series readout section connected to the end of the first filament opposite to another end thereof connected to the second filament.

The semiconductor device according to the embodiment of the present disclosure can be provided with a reliable multi-valued electrical fuse element which can be manufactured using existing processes without any additional processing step.

The method of driving a semiconductor device according to the embodiment of the present disclosure makes it possible to read the resistance of a multi-valued fuse element with high reliability from a semiconductor device including an electrical fuse which can be manufactured using existing processes without any additional processing step.

DETAILED DESCRIPTION

Embodiments of a semiconductor device and a method of manufacturing the device according to the present disclosure will now be described with reference to the drawings.

The following items will be described in the order listed.

1. First Embodiment (Basic Configuration)
2. Experimental Results
3. Second Embodiment (Configuration Different from First Embodiment in the Position of Selection Transistors)

First Embodiment

Configuration of Semiconductor Device

Figure 1A:
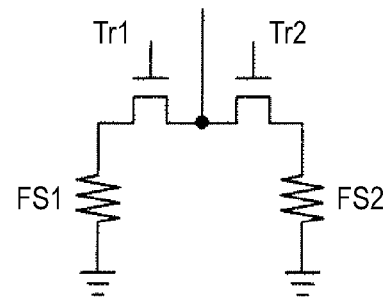
FIGS. 1A and 1B are circuit diagrams of an electric fuse element forming a part of a semiconductor device according to a first embodiment of the present disclosure.

FIG. 1A is a circuit diagram of an electrical fuse element forming a part of a semiconductor device according to an embodiment of the present disclosure.

The semiconductor device of the present embodiment has an electrical fuse element including a first filament FS1 and a second filament FS2 connected to the first filament FS1.

A first selection transistor Tr1 for selecting the first filament FS1 is series-connected to the first filament FS1 at an end of the filament connected to the second filament FS2.

A second selection transistor Tr2 for selecting the second filament FS2 is series-connected to the second filament FS2 at an end of the filament connected to the first filament FS1.

A series readout section for reading series resistance of the first filament FS1 and the second filament FS2 is connected, for example, to an end of the first filament FS1 opposite to the end the filament connected to the second filament FS2.

In the above-described configuration, series resistance of the first filament FS1 and the second filament FS2 can be readout, and it is therefore possible to provide a multi-valued reliable electrical fuse.

The value of either the first filament FS1 or the second filament FS2 can be selected and written by selecting either the first selection transistor Tr1 or the second selection transistor Tr2.

Figure 1B:
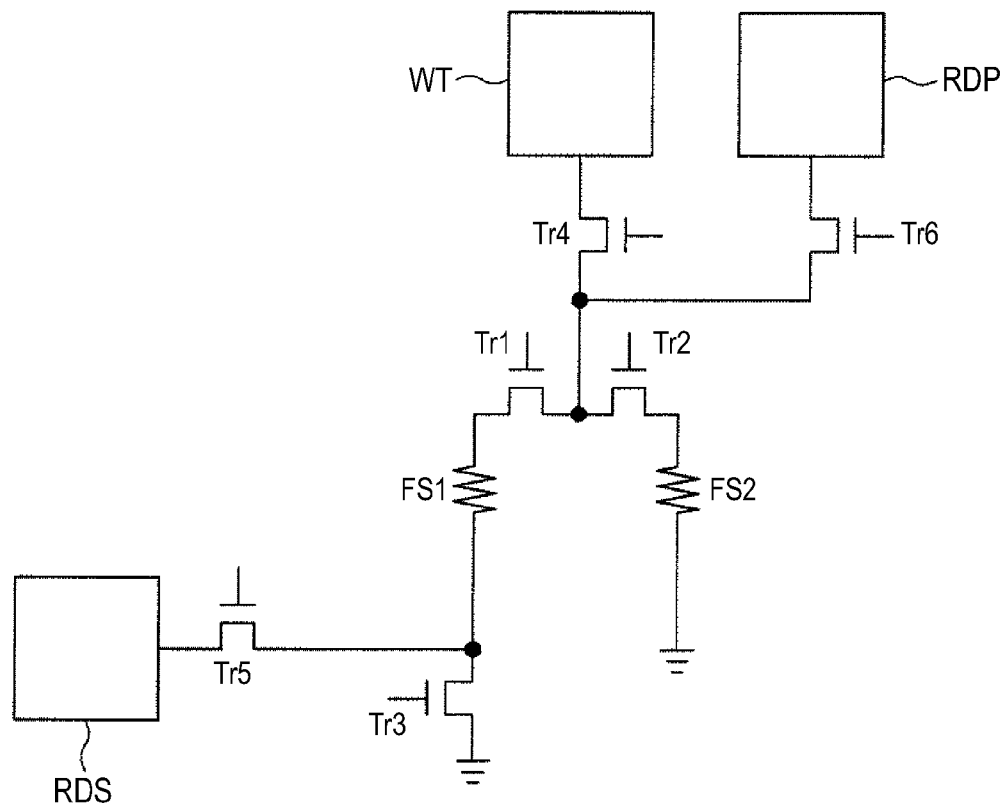

FIG. 1B is a circuit diagram of the electrical fuse element forming a part of the semiconductor device according to the embodiment, the diagram showing the configuration in FIG. 1A more specifically.

The semiconductor device of the embodiment has the electrical fuse element including the first filament FS1 and the second filament FS2 connected to the first filament FS1.

The first selection transistor Tr1 for selecting the first filament FS1 is series-connected to the first filament FS1 at an end of the filament connected to the second filament FS2.

The second selection transistor Tr2 for selecting the second filament FS2 is series-connected to the second filament FS2 at an end of the filament connected to the first filament FS1.

In the present embodiment, the first filament FS1 and the second filament FS2 are connected through the first selection transistor Tr1 and the second selection transistor Tr2.

For example, the end of the first filament FS1 opposite to the end of the filament collected to the second filament FS2 is connected to the ground through a transistor Tr3.

For example, a write section WT is connected through a transistor Tr4 to the connection between the first selection transistor Tr1 and the second selection transistor Tr2. The write section WT causes the resistance of the first filament FS1 or the second filament FS2 selected through the first selection transistor Tr1 or the second selection transistor Tr2 to vary independently.

For example, a series readout section RDS is connected through a transistor Tr5 to the connection between the first filament FS1 and the transistor Tr3. The series readout section RDS reads series resistance of the first filament FS1 and the second filament FS2.

For example, a parallel readout section RDP is connected through a transistor Tr6 to the connection between the first selection transistor Tr1 and the second selection transistor Tr2. The parallel readout section RDP reads parallel resistance of the first filament FS1 and the second filament FS2.

In the above-described configuration, the value of either the first filament FS1 or the second filament FS2 can be written by selecting the filament using the first selection transistor Tr1 and the second selection transistor Tr2.

Series resistance of the first filament FS1 and the second filament FS2 can be read out, and a reliable multi-valued electrical fuse can be provided.

Further, parallel resistance of the first filament FS1 and the second filament FS2 can be read out to achieve higher reliability.

Figure 2A:
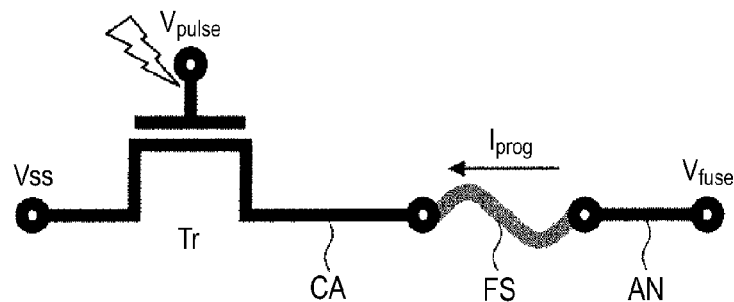
FIG. 2A is a circuit diagram of one electric fuse forming a part of the electrical fuse element of the semiconductor device according to the first embodiment of the present disclosure.
Figure 2B:
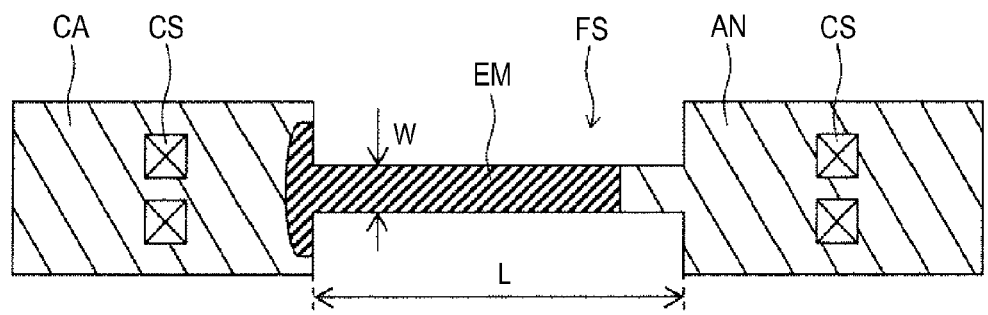
FIG. 2B is a plan view of the electrical fuse.

FIG. 2A is a circuit diagram of one electrical fuse forming the electrical fuse element of the semiconductor device according to the present embodiment, and FIG. 2B is a plan view of the electrical fuse.

For example, an anode AN is formed at one end of a filament FS forming a part of the electrical fuse, and a cathode CA is formed at another end of the filament. The cathode CA is connected to a ground potential Vss through a transistor Tr.

For example, when a write voltage $V_{fuse}$ is applied to the anode AN to apply a write pulse $V_{pulse}$ to the transistor, a write current $I_{prog}$ flows through the filament FS to enable a write process.

A write process is also referred to as "blow process", and a write voltage is also referred to as "blow voltage".

Figure 2C:
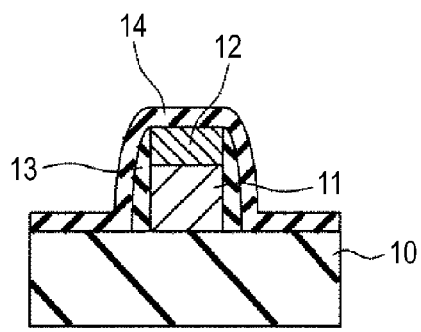
FIG. 2C is a sectional view of the electrical fuse.

FIG. 2C is a sectional view of a filament section of the electrical fuse.

For example, a polysilicon layer 11 and a layer 12 of a high melting point metal silicide such as NiSi are stacked on an insulation film 10 on a semiconductor substrate, and shaped into the form of a filament having a predetermined width W and a predetermined length L as shown in FIG. 2B.

For example, sidewall insulation films 13 are formed on two sides of the layered body having the polysilicon layer 11 and the high melting point silicide layer 12, and a protective insulation film 14 is formed to cover the films and layers.

The anode AN and the cathode CA basically have a layer configuration similar to that of the filament section except that forming regions are different and contacts CS are formed.

For example, when a first write voltage is applied to the filament constituted by the layered body having the polysilicon layer 11 and the high melting point silicide layer 12 as described above, electro migration occurs at the high melting point silicide layer, which results in a change in the resistance of the filament section.

FIG. 2B shows electro migration EM from the filament section into a part of the cathode CA. The high melting point metal silicide layer remains in a region where no electro migration EM takes place.

When a second write voltage higher than the first write voltage is further applied, the silicon in the polysilicon layer is melted to cause a further change in the resistance of the filament section.

As a result, for example, three stepwise resistance values can be imparted to the single filament according to a write voltage.

The first filament FS1 and the second filament FS2 may be provided with different resistance values. Thus, it can be further ensured that the electric fuse element will be provided with a multiplicity of resistance values.

For example, the first and second filaments can be provided with different resistance values by making them different in at least any of the following aspects.

(1) the width of the first filament FS1 and the second filament FS2

(2) the length of the first filament FS1 and the second filament FS2

(3) the number of the contacts CS provided in the cathodes CA and the anodes AN of the first filament FS1 and the second filament FS2

(4) the position of the contacts CS provided in the cathodes CA and the anodes AN of the first filament FS1 and the second filament FS2

The first filament FS1 and the second filament FS2 may be configured such that the resistance values of those filaments will be varied according to different electrical conditions. It is therefore possible to ensure that the electrical fuse element will be provided with a multiplicity of resistance values.

For example, the resistance of the first filament FS1 and the second filament FS1 may be varied according to different electrical conditions similarly to the way the above-described conditions for setting the resistance of the first filament and the second filament differently.

Further, the setup for varying the resistance of the first filament FS1 and the second filament FS2 according to different electrical conditions may be employed when the first and the second filaments have different resistance values.

The first filament FS1 and the second filament FS2 may have the same resistance value, and the resistance value of the first and second filaments may be varied according to the same electrical conditions.

The electrical fuse element of the semiconductor device of the present embodiment can be manufactured using existing processes without any additional processing step, and the element can be provided with high reliability and a multiplicity of resistance values.

Method of Driving Semiconductor Device

Figure 3A:
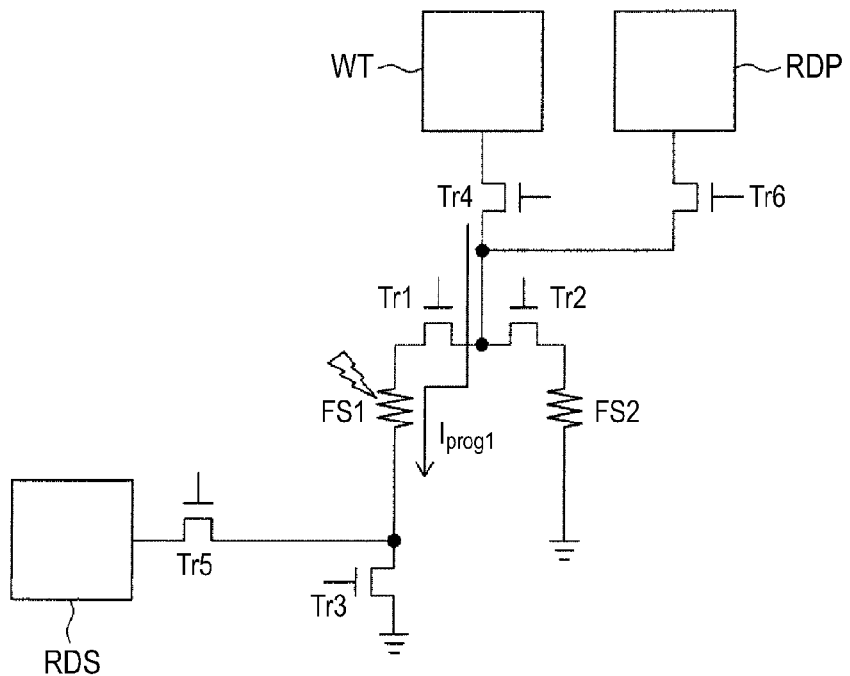
FIGS. 3A and 3B are circuit diagrams showing a method of writing a value in the electrical fuse element forming a part of the semiconductor device according to the first embodiment of the present disclosure.

FIG. 3A is a circuit diagram showing a method of writing the first filament FS1 of the electrical fuse element forming a part of the semiconductor device according to the present embodiment.

For example, the transistor Tr3 and the transistor Tr4 are turned on with the first filament FS1 selected by turning the first selection transistor Tr1 on, whereby a write voltage is applied from the write section WT to pass a write current $I_{prog1}$ through the first filament FS1.

Thus, for example, three stepwise resistance values can be imparted as described above to the first filament FS1 selectively according to the write voltage.

Figure 3B:
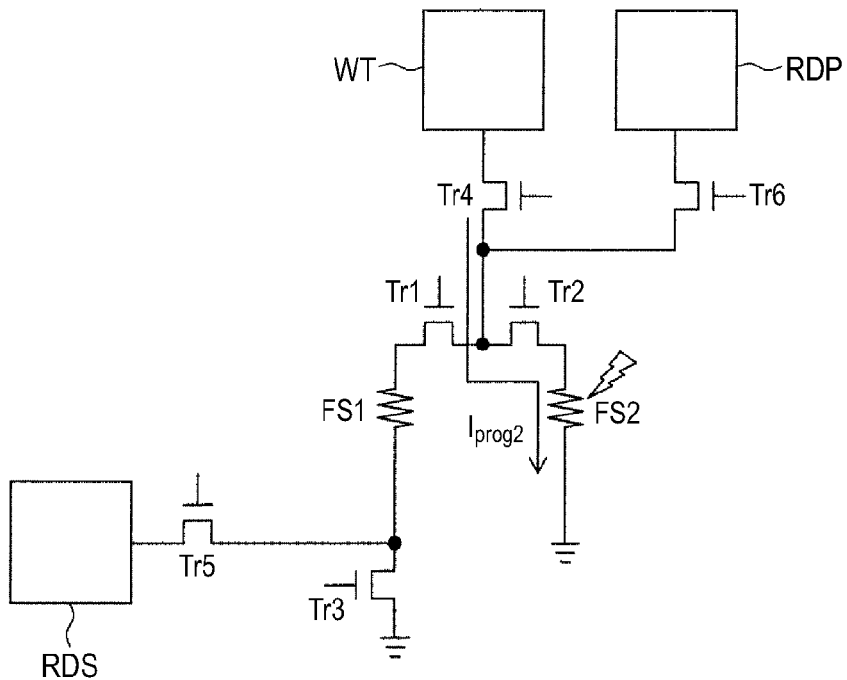

FIG. 3B is a circuit diagram showing a method of writing the second filament FS2 of the electrical fuse element forming a part of the semiconductor device according to the present embodiment.

For example, the transistor Tr4 is turned on with the second filament FS2 selected by turning the second selection transistor Tr2 on, whereby a write voltage is applied from the write section WT to pass a write current $I_{prog2}$ through the second filament FS2.

Thus, three stepwise resistance values can be imparted as described above to the second filament FS2 selectively according to the write voltage.

As described above, the first selection transistor Tr1 for selecting the first filament FS1 is series-connected to the first filament FS1, and the second selection transistor Tr2 for selecting the second filament FS2 is series-connected to the second filament FS2.

Thus, the write section WT can cause the resistance of the first filament FS1 or the second filament FS2 selected through the first selection transistor Tr1 or the second selection transistor Tr2 as described above to vary independently.

Figure 4A:
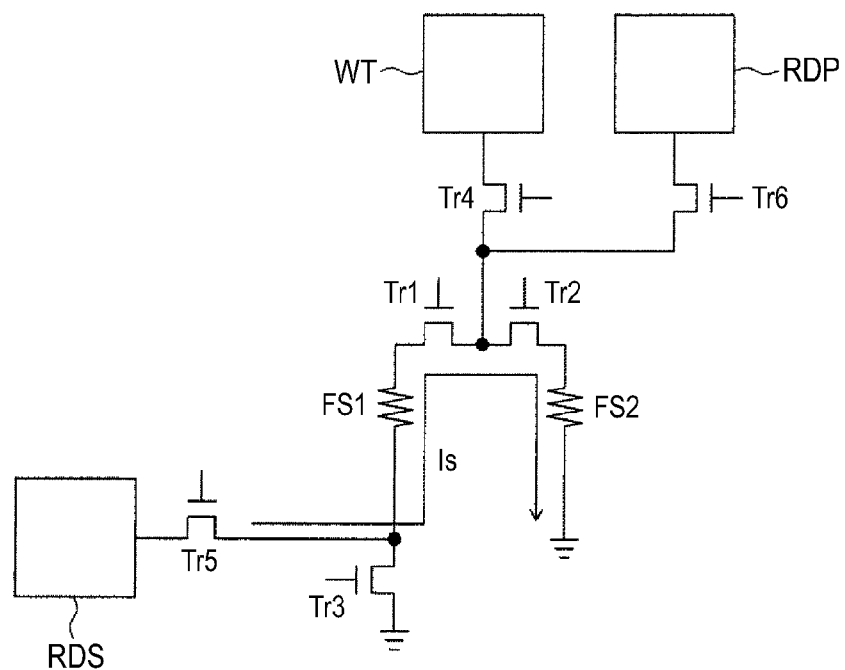
FIGS. 4A and 4B are circuit diagrams showing a method of reading a value from the electrical fuse element forming a part of the semiconductor device according to the first embodiment of the present disclosure.

FIG. 4A is a circuit diagram showing a method for series readout of the electrical fuse element forming a part of the semiconductor device according to the present embodiment.

For example, the transistor Tr5 is turned on with the first filament FS1 and the second filament FS2 series-connected with each other by turning the first selection transistor Tr1 and the second selection transistor Tr2 on, whereby a series readout current $I_s$ from the series readout section RDS is passed through the element.

Series resistance of the first filament FS1 and the second filament FS2 can be read out by performing resistance measurement at this time.

Figure 4B:
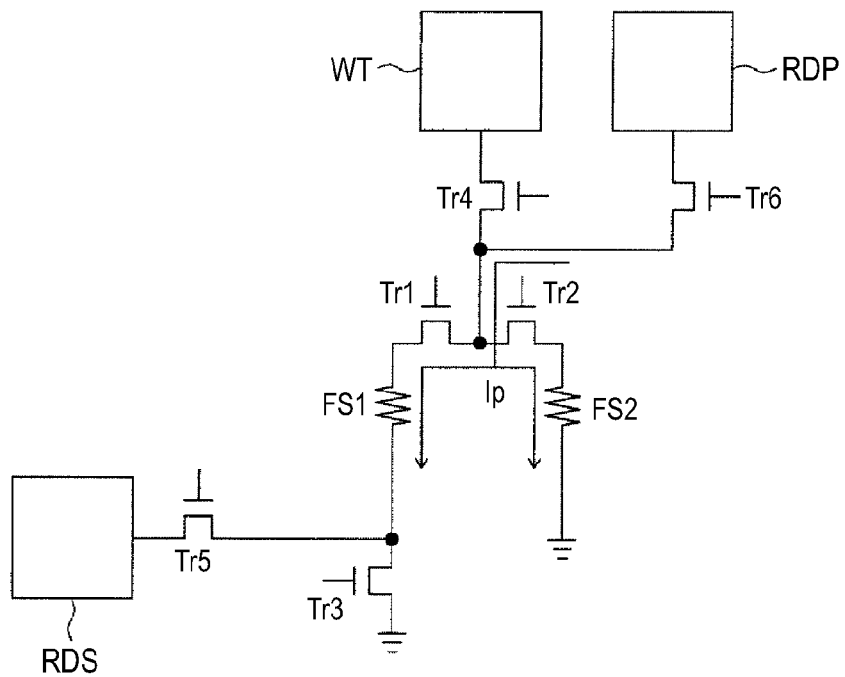

FIG. 4B is a circuit diagram showing a method for parallel readout of the electrical fuse element forming a part of the semiconductor device according to the present embodiment.

For example, the transistor Tr3 and the transistor Tr6 are turned on with the first selection transistor Tr1 and the second selection transistor Tr2 in the on-state, whereby a parallel readout current $I_p$ from the parallel readout section RDP is passed through the element.

Parallel resistance of the first filament FS1 and the second filament FS2 can be read out by performing resistance measurement at this time.

The method of driving a semiconductor device according to the present embodiment allows reliable readout from a multi-valued fuse element of a semiconductor device having an electrical fuse which can be manufactured using existing processes without any additional processing step.

Experimental Results

Series resistance and parallel resistance of the electrical fuse element of the semiconductor device according to the embodiment were calculated from resistance values that the first filament and the second filament were set to have before and after blow processes.

The initial resistance of the first filament and the second filament was set at 500Ω.

The first and second filaments had resistance of 3,000Ω and 5,000Ω, respectively, after a blow process which caused electro migration.

The first and second filaments had resistance of 100,000Ω after a blow process which caused silicon melting.

Series readout resistance and parallel readout resistance as shown on Table 1 were obtained from various combinations of the resistance values of the first and second filaments as described above.

TABLE 1

| Value | FS1 [Ω] | FS2 [Ω] | Series Readout Resistance [Ω] | Parallel Readout Resistance [Ω] |
|---|---|---|---|---|
| 0 | 500 | 500 | 1000 | 250 |
| 1 | 3000 | 500 | 3500 | 429 |
| 2 | 500 | 5000 | 5500 | 455 |
| 3 | 3000 | 5000 | 8000 | 1875 |
| 4 | 500 | 100000 | 100500 | 498 |
| 5 | 3000 | 100000 | 103000 | 2913 |
| 6 | 100000 | 500 | 100500 | 498 |
| 7 | 100000 | 5000 | 105000 | 4762 |
| 8 | 100000 | 100000 | 200000 | 50000 |

As shown on Table 1, nine values from values 0 to 8 are available as combinations of series readout resistance ad parallel readout resistance.

In particular, the series readout resistance values designated by "0", "1", "2", and "3" in Table 1 can be used as values which are clearly distinguishable from each other.

In practice, it is difficult to distinguish the series readout resistance values not less than 100500Ω from each other. It also holds true for the parallel readout resistance. For example, it is difficult to distinguish between the resistance values on the 400Ω level which are close to each other.

For example, the values designated by "0", "3", "5", and "7" on Table 1 may be used to provide an electrical fuse element which allows selection from four values.

Changes in resistance as described above are read out, for example, by varying the reference potential of a sense amplifier, and a multiplicity of resistance values can be obtained without using an AND circuit.

Figure 5:
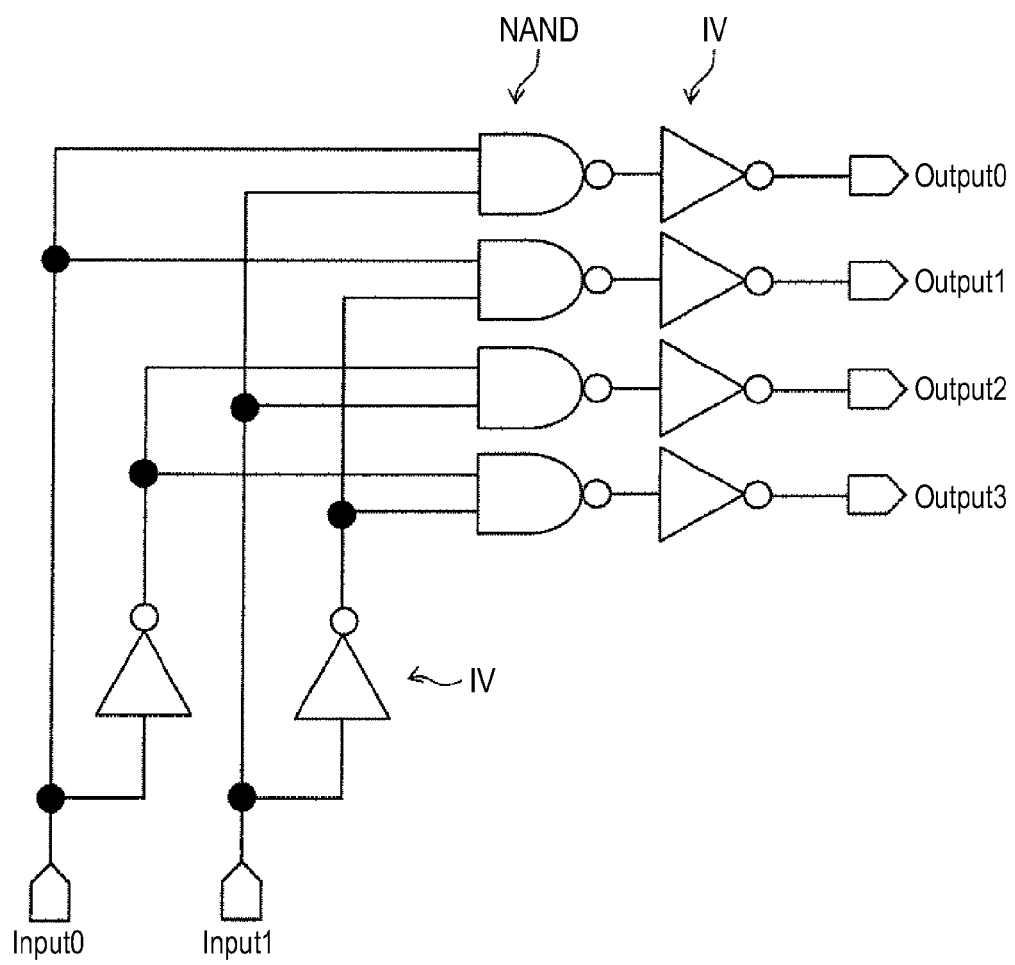
FIG. 5 is a circuit diagram of an example of a decoder circuit which may be omitted in the semiconductor device according to the first embodiment of the present disclosure.

FIG. 5 is a circuit diagram of an example of a decoder circuit which may be omitted in the semiconductor device according to the present embodiment.

For example, the decoder includes six inverters IV and four NAND circuits to output four values from input of two values. The inverter IV includes one each n-channel transistor and p-channel transistor, and the NAND circuit includes two each n-channel transistors and p-channel transistors. Therefore, the decoder includes 28 transistors in total, and the omission of such a decoder makes a significant contribution to the compactness of the semiconductor device.

Although the present embodiment employs a configuration including a parallel readout section to read parallel resistance, such a configuration is not necessarily required, and the parallel readout section may be omitted as long as distinguishable resistance values can be obtained only by reading series resistance.

The parallel readout section can be made to read the resistance values of the first filament FS1 and the second filament FS2 separately by selecting the first selection transistor and the second selection transistor, respectively.

Although the above embodiment has been descried as having a series readout section and a parallel readout section, the present disclosure is not limited to such a configuration. The parallel readout section may be omitted when only series readout is to be performed, and the series readout section may be omitted when only parallel readout is to be performed.

Second Embodiment

Configuration of Semiconductor Device

Figure 6A:
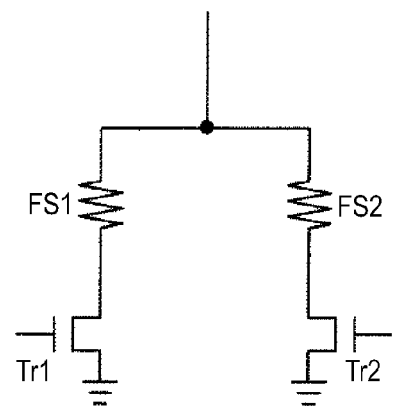
FIGS. 6A and 6B are circuit diagrams of an electrical fuse element forming a part of a semiconductor device according to a second embodiment of the present disclosure.

FIG. 6A is a circuit diagram of an electrical fuse element forming a part of a semiconductor device according to a second embodiment of the present disclosure.

The semiconductor device according to the embodiment has an electrical fuse element including a first filament FS1 and a second filament FS2 connected to the first filament FS1.

A first selection transistor Tr1 for selecting the first filament FS1 is series-connected to an end of the first filament FS1 opposite to an end of the filament connected to the second filament FS2.

A second selection transistor Tr2 for selecting the second filament FS2 is series-connected to an end of the second filament FS2 opposite to an end of the filament connected to the first filament FS1.

For example, a series readout section for reading series resistance of the first filament FS1 and the second filament FS2 is connected to an end of the first selection transistor Tr1 opposite to an end of the transistor connected to the first filament FS1.

In the above-described configuration, the series resistance of the first filament FS1 and the second filament FS2 can be read out, and a reliable multi-valued electrical fuse can be obtained.

Either the first filament FS1 or the second filament FS2 can be written by selecting the filament through either the first selection transistor Tr1 or the second selection transistor Tr2.

Figure 6B:
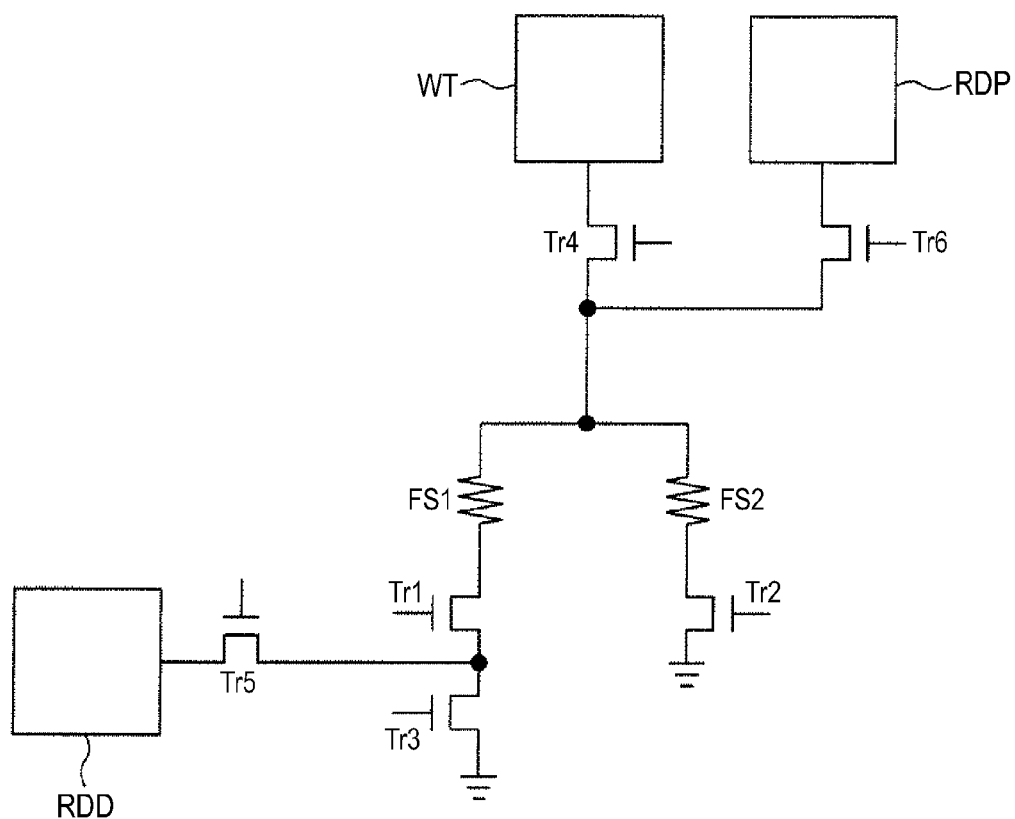

FIG. 6B is a circuit diagram of the electrical fuse element forming a part of the semiconductor device according to the present embodiment, the diagram more specifically showing the configuration in FIG. 6A.

The semiconductor device according to the present embodiment has the electrical fuse element including the first filament FS1 and the second filament FS2 connected to the first element FS1.

For example, the first selection transistor Tr1 for selecting the first filament FS1 is series-connected to the end of the first filament FS1 opposite to the end of the filament connected to the second filament FS2.

For example, the second selection transistor Tr2 for selecting the second filament FS2 is series-connected to the end of the second filament FS2 opposite to the end of the filament connected to the first filament FS1.

In the present embodiment, the first filament FS1 and the second filament FS2 are directly connected to each other.

For example, an end of the first selection transistor Tr1 opposite to the end of the transistor connected to the first filament FS1 is grounded through a transistor Tr3.

For example, a write section WT is connected through a transistor Tr4 to the connection between the first filament FS1 and the second filament FS2. The write section WT causes the resistance of the first filament FS1 or the second filament FS2 selected through the first selection transistor Tr1 or the second selection transistor Tr2 to vary independently.

For example, a series readout section RDS is connected through a transistor Tr5 to the connection between the first selection transistor Tr1 and the transistor Tr3. The series readout section RDS reads series resistance of the first filament FS1 and the second filament FS2.

For example, a parallel readout section RDP is connected through a transistor Tr6 to the connection between the first filament FS1 and the second filament FS2. The parallel readout section RDP reads parallel resistance of the first filament FS1 and the second filament FS2.

In the above-described configuration, the value of either the first filament FS1 or the second filament FS2 can be written by selecting the filament using the first selection transistor Tr1 and the second selection transistor Tr2.

Series resistance of the first filament FS1 and the second filament FS2 can be readout, and a reliable multi-valued electrical fuse can be provided.

Further, parallel resistance of the first filament FS1 and the second filament FS2 can be read out to achieve higher reliability.

The electrical fuse forming a part of the electrical fuse element of the semiconductor device according to the embodiment is similar to the fuse of the first embodiment. For example, three stepwise resistance values can be imparted to one filament according to a write voltage.

The electrical fuse element of the semiconductor device of the present embodiment can be manufactured using existing processes without any additional processing step, and the element can be provided with high reliability and a multiplicity of resistance values.

Method of Driving Semiconductor Device

Figure 7A:
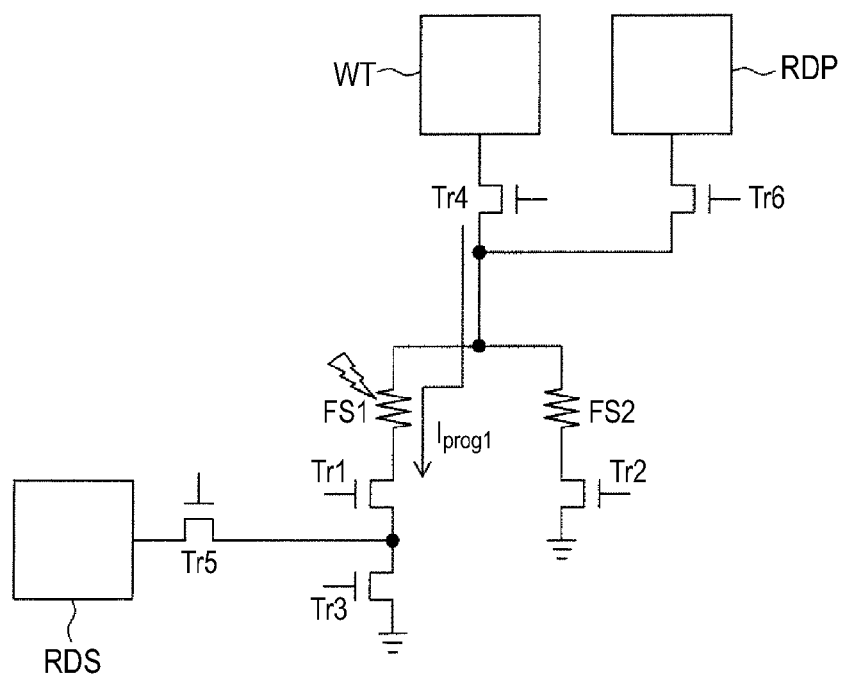
FIGS. 7A and 7B are circuit diagrams showing a method of writing a value in the electrical fuse element forming a part of the semiconductor device according to the second embodiment of the present disclosure.

FIG. 7A is a circuit diagram showing a method of writing the first filament FS1 of the electrical fuse element forming a part of the semiconductor device according to the present embodiment.

For example, the transistor Tr3 and the transistor Tr4 are turned on with the first filament FS1 selected by turning the first selection transistor Tr1 on, whereby a write voltage is applied from the write section WT to pass a write current $I_{prog1}$ through the first filament FS1.

As a result, for example, three stepwise resistance values can be selectively imparted to the first filament FS1 as described above according to the write voltage.

Figure 7B:
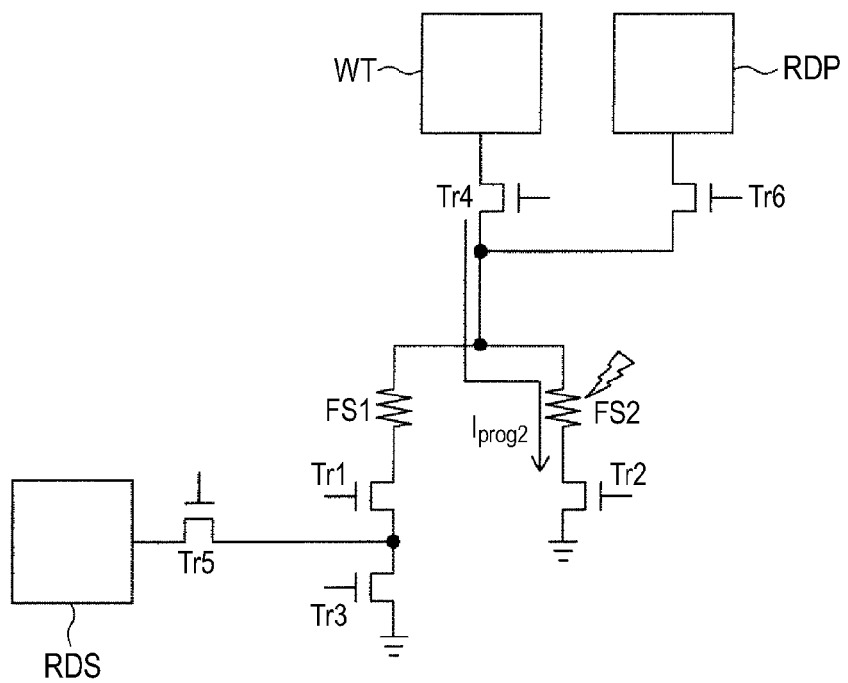

FIG. 7B is a circuit diagram showing a method of writing the second filament FS2 of the electrical fuse element forming a part of the semiconductor device according to the present embodiment.

For example, the transistor Tr4 is turned on with the second filament FS2 selected by turning the second selection transistor Tr2 on, whereby a write voltage is applied from the write section WT to pass a write current $I_{prog2}$ through the second filament FS2.

As a result, for example, three stepwise resistance values can be selectively imparted to the second filament FS2 as described above according to the write voltage.

As described above, the first selection transistor Tr1 for selecting the first filament FS1 is series-connected to the first filament FS1, and the second selection transistor Tr2 for selecting the second filament FS2 is series-connected to the second filament FS2.

Thus, the write section WT can cause the resistance of the first filament FS1 or the second filament FS2 selected through the first selection transistor Tr1 or the second selection transistor Tr2 to vary independently.

Figure 8A:
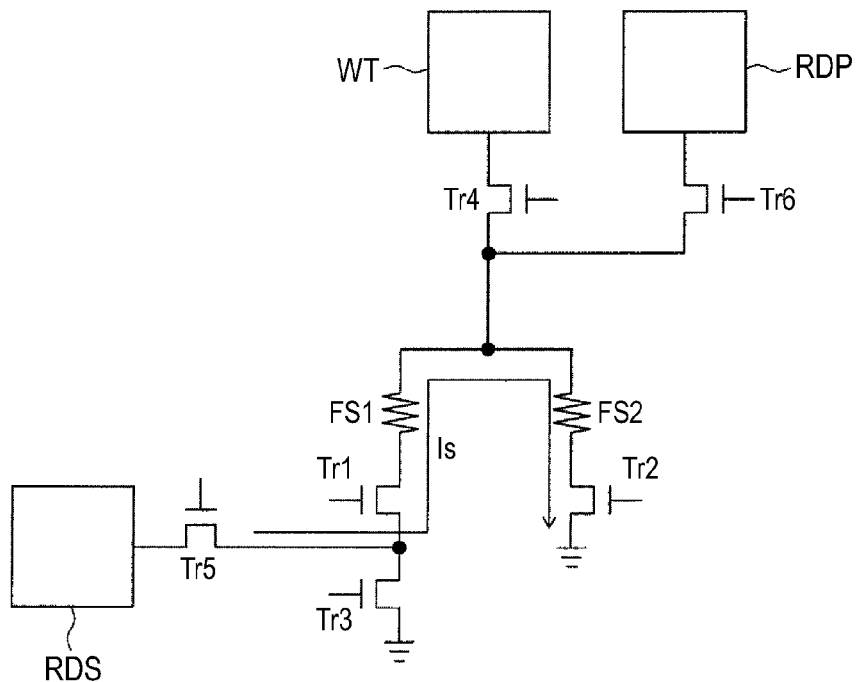
FIGS. 8A and 8B are circuit diagrams showing a method of reading a value from the electrical fuse element forming a part of the semiconductor device according to the second embodiment of the present disclosure.

FIG. 8A is a circuit diagram showing a method for series readout of the electrical fuse element forming a part of the semiconductor device according to the present embodiment.

For example, the transistor Tr5 is turned on with the first selection transistor Tr1 and the second selection transistor Tr2 in the on-state, whereby a series readout current $I_s$ from the series readout section RDS is passed through the element.

Series resistance of the first filament FS1 and the second filament FS2 can be read out by performing resistance measurement at this time.

Figure 8B:
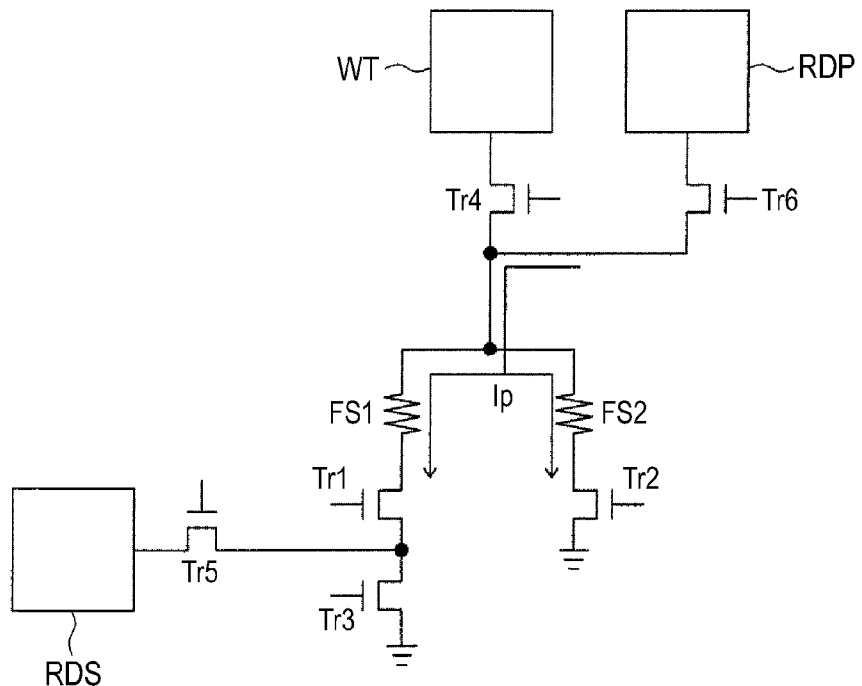

FIG. 8B is a circuit diagram showing a method for parallel readout of the electrical fuse element forming a part of the semiconductor device according to the present embodiment.

For example, the transistor Tr3 and the transistor Tr6 are turned on with the first selection transistor Tr1 and the second selection transistor Tr2 in the on-state, whereby a parallel readout current $I_p$ from the parallel readout section RDP is passed through the element.

Parallel resistance of the first filament FS1 and the second filament FS2 can be read out by performing resistance measurement at this time.

The method of driving a semiconductor device according to the present embodiment allows reliable readout from a multi-valued fuse element of a semiconductor device having an electrical fuse which can be manufactured using existing processes without any additional processing step.

Although the embodiment has been described as having a configuration including a parallel readout section for reading parallel resistance, such a section is not necessarily required, and the parallel readout section may be omitted as long as distinguishable resistance values can be obtained only by reading series resistance.

The parallel readout section can be made to read the resistance values of the first filament FS1 and the second filament FS2 separately by selecting the first selection transistor and the second selection transistor, respectively.

Although the above embodiment has been descried as having a series readout section and a parallel readout section, the present disclosure is not limited to such a configuration. The parallel readout section may be omitted when only series readout is to be performed, and the series readout section may be omitted when only parallel readout is to be performed.

The semiconductor devices according to the above-described embodiments provide the following advantages.

(1) A reliable multi-valued electrical fuse element can be provided using existing processes without any additional processing steps.

(2) The size of a cell can be reduced when the values provided by the cell are kept unchanged.

(3) A reliable multi-valued electrical fuse can be provided using existing processes without any additional processing steps.

The present disclosure is not limited to the above description.

For example, the filaments forming the electrical fuse of the embodiment are constituted by layered bodies having a polysilicon layer and a high melting point metal silicide layer. The present disclosure is not limited to such filaments, and other types of filaments may be used to provide electrical fuses having various configurations.

Various modifications may be made without departing from the spirit of the present disclosure.

The present disclosure contains subject matter related to that disclosed in Japanese Priority Patent Application JP 2010-172205 filed in the Japan Patent Office on Jul. 30, 2010, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device comprising an electrical fuse element comprising:
   a first filament;
   a second filament connected to the first filament;
   a series readout section connected to an end of the first filament opposite to another end of the first filament connected to the second filament,
   wherein the series readout section reads value of series resistance of the first filament and the second filament, wherein a value of each of the first filament and the second filament is written based on a write voltage applied to the first filament and the second filament; and
   a parallel readout section connected to the connection between the first filament and the second filament, wherein the parallel readout section reads value of parallel resistance of the first filament and the second filament.

2. The semiconductor device according to claim 1, wherein:
   a first selection transistor to select the first filament is series-connected to the first filament, and
   a second selection transistor to select the second filament is series-connected to the second filament.

3. The semiconductor device according to claim 2, further comprising a write section connected to the connection between the first filament and the second filament,
   wherein the write section varies the resistance of the first filament or the second filament independently, selected by the first selection transistor or the second selection transistor respectively.

4. The semiconductor device according to claim 1, wherein the first filament and the second filament are different in resistance because of one or more of: a difference between the first filament and the second filament in width, a difference between the first filament and the second filament in length, a difference between the first filament and the second filament in the number of contacts provided at cathodes and anodes of the filaments, and a difference between the first filament and the second filament in the position of the contacts.

5. The semiconductor device according to claim 1, wherein the first filament and the second filament are different in terms of electrical conditions for varying the resistance of the first filament and the second filament.

6. The semiconductor device according to claim 5, wherein the first filament and the second filament are different in resistance, the difference further originating from one or more of: a difference between the first filament and the second filament in width, a difference between the first filament and the second filament in length, a difference between the first filament and the second filament in the number of contacts provided at cathodes and anodes of the filaments, and a difference between the first filament and the second filament in the position of the contacts.

7. The semiconductor device according to claim 1, further comprising
   a write section connected to the connection between the first filament and the second filament,
   wherein the write section changes the resistance of the first filament or the second filament independently, selected by a first selection transistor or a second selection transistor respectively,
   wherein a change in the resistance occurs due to electro migration at a silicide layer in the first filament or the second filament.

8. The semiconductor device according to claim 1, further comprising a write section connected to the connection between the first filament and the second filament,
   wherein the write section changes the resistance of the first filament or the second filament independently, selected by a first selection transistor or a second selection transistor respectively,
   wherein a change in the resistance occurs due to melting of a polysilicon layer in the first filament or the second filament.

9. A semiconductor device comprising an electrical fuse element comprising:
   a first filament;
   a second filament connected to the first filament;
   a first selection transistor series-connected to the first filament for selecting the first filament;
   a second selection transistor series-connected to the second filament for selecting the second filament;
   a series readout section connected to an end of the first filament opposite to another end of the first filament connected to the second filament, wherein the series readout section reads value of series resistance of the first filament and the second filament; and
   a parallel readout section connected to the connection between the first filament and the second filament, wherein the parallel readout section reads value of parallel resistance of the first filament and the second filament, wherein a value of each of the first filament and the second filament is written based on a write voltage applied to the first filament and the second filament.

10. The semiconductor device according to claim 9, further comprising a write section connected to the connection between the first filament and the second filament, wherein the write section varies the resistance of the first filament or the second filament independently, selected by the first selection transistor or the second selection transistor respectively.

11. The semiconductor device according to claim 9, wherein the first filament and the second filament are different in resistance because of one or more of: a difference between the first filament and the second filament in width, a difference between the first filament and the second filament in length, a difference between the first filament and the second filament in the number of contacts provided at cathodes and anodes of the filaments, and a difference between the first filament and the second filament in the position of the contacts.

12. The semiconductor device according to claim 9, wherein the first filament and the second filament are different in terms of electrical conditions for varying the resistance of the first filament and the second filament.

13. The semiconductor device according to claim 12, wherein the first filament and the second filament are different in resistance, the difference further originating from one or more of: a difference between the first filament and the second filament in width, a difference between the first filament and the second filament in length, a difference between the first filament and the second filament in the number of contacts provided at cathodes and anodes of the filaments, and a difference between the first filament and the second filament in the position of the contacts.

14. A method of driving a semiconductor device including an electrical fuse element, the method comprising:
    reading value of series resistance of a first filament and a second filament of the electrical fuse element using a series readout section connected to an end of the first filament opposite to another end thereof connected to the second filament, wherein a value of each of the first filament and the second filament is written based on a write voltage applied to the first filament and the second filament; and
    reading value of parallel resistance of the first filament and the second filament using a parallel readout section connected to the connection between the first filament and the second filament.

15. The method of driving the semiconductor device according to claim 14,
    wherein the semiconductor device has a first selection transistor series-connected to the first filament for selecting the first filament and a second selection transistor series-connected to the second filament for selecting the second filament,
    the method further comprising varying the resistance of the first filament or the second filament independently, selected by the first selection transistor or the second selection transistor respectively, using a write section connected to the connection between the first filament and the second filament.

* * * * *